United States Patent [19]

Raush

[11] 4,448,522
[45] May 15, 1984

[54] DEVICE FOR SUPPORTING AND ALIGNING PHOTOGRAPHIC MASTERS

[75] Inventor: Russell G. Raush, Conestoga, Pa.

[73] Assignee: RCA Corporation, New York, N.Y.

[21] Appl. No.: 435,969

[22] Filed: Oct. 22, 1982

[51] Int. Cl.³ .............................................. G03B 27/02
[52] U.S. Cl. ........................................ 355/78; 355/89
[58] Field of Search ................... 355/1, 9, 23, 24, 25, 355/26, 72, 78, 89, 91, 90

[56] References Cited

U.S. PATENT DOCUMENTS 2,720,146  10/1955  Mears .................................... 355/89

OTHER PUBLICATIONS

RCA Technical Note #1297, published on Mar. 17, 1982 by James Kleppinger.

*Primary Examiner*—L. T. Hix
*Assistant Examiner*—Brian W. Brown
*Attorney, Agent, or Firm*—Eugene M. Whitacre; Lester L. Hallacher; Dennis H. Irlbeck

[57] ABSTRACT

A chase for photographically producing images on both sides of shadow mask material includes a fixed suspension member and a moveable suspension member which is vertically and horizontally moveable relative to the fixed suspension member in the plane of the moveable suspension member. Support members are suspended from the suspension members through solid flexible hinges. Frames are indivdually supported by the support members and include openings for receiving photographic plates. Pivoting means are coupled to the frames whereby the frames are held in a substantially parallel relationship during exposure of the shadow mask material and are separable by flexure of the hinges during changing of the mask material. The images on the plates are alignable by selectively moving the moveable suspension member vertically or horizontally.

13 Claims, 5 Drawing Figures

DEVICE FOR SUPPORTING AND ALIGNING PHOTOGRAPHIC MASTERS

BACKGROUND OF THE DISCLOSURE

This invention relates generally to a device for supporting and aligning photographic masters used in producing images on both sides of a photographic medium, and particularly to a chase for producing aperture patterns on kinescope shadow mask material.

During the production of shadow masks for color television picture tubes, a large strip of thin metal is coated on both sides with a photoresist material. The coated material is passed through an exposure device, typically called a chase, which supports two photographic plates. The photographic plates include the aperture patterns which are to be exposed onto both sides of the shadow mask material. Both sides of the material are flooded with light while the mask material rests between the two masters. The unexposed photoresist material is washed away leaving the desired apertures unprotected. The material is passed through an acid tank and the apertures are etched through the material. Because etching occurs from both sides of the metal, the aperture patterns on the two sides of the material must be properly aligned. Accordingly, the photographic plates must be precisely aligned in the chase prior to the light exposure. The maintenance of precise alignment of the photographic plates is difficult because the frames in which the plates are mounted must be opened and closed during the insertion and removal of the metal. This repeated opening and closing of the frames causes the bearings, joints and other elements to wear and develop play which makes the maintenance of alignment very difficult, or impossible. Another disadvantage of existing chases arises because the plates are placed into the chase from the top, thereby requiring the operator to stand on a ladder while inserting and removing the plates.

The instant invention overcomes these problems by the provision of a chase in which the photographic plates are easily aligned while firmly held in the chase, and in which the plates are readily accessible to the operator for changing and aligning.

SUMMARY OF THE INVENTION

A device for supporting and aligning masters used for photographically producing images on both sides of a medium includes a support structure. A fixed suspension member and a moveable suspension member are supported by the support structure whereby the plane of the fixed suspension member is substantially parallel to the plane of the moveable suspension member. The moveable suspension member is vertically and horizontally moveable relative to the fixed suspension member in the plane of the moveable suspension member. First and second support members are suspended from the fixed and moveable suspension members through flexible hinges. A first frame is supported by the first support member and includes an opening for receiving a first photographic plate, and fluid actuated means for holding the plate in the opening. A second frame is supported by the second support member and includes an opening for receiving a second photographic plate, and fluid actuated means for holding the second plate in the opening. The first and second support members are pivotable about the flexible hinges whereby the frames are held in a substantially parallel relationship during exposure of the medium, are separable by pivoting about the hinges during changing of the medium and whereby the images on the plates are alignable by selectively moving the moveable suspension member vertically and horizontally.

DETAILED DESCRIPTION OF THE PREFERRED EMBODIMENT

Figures 1, 2:
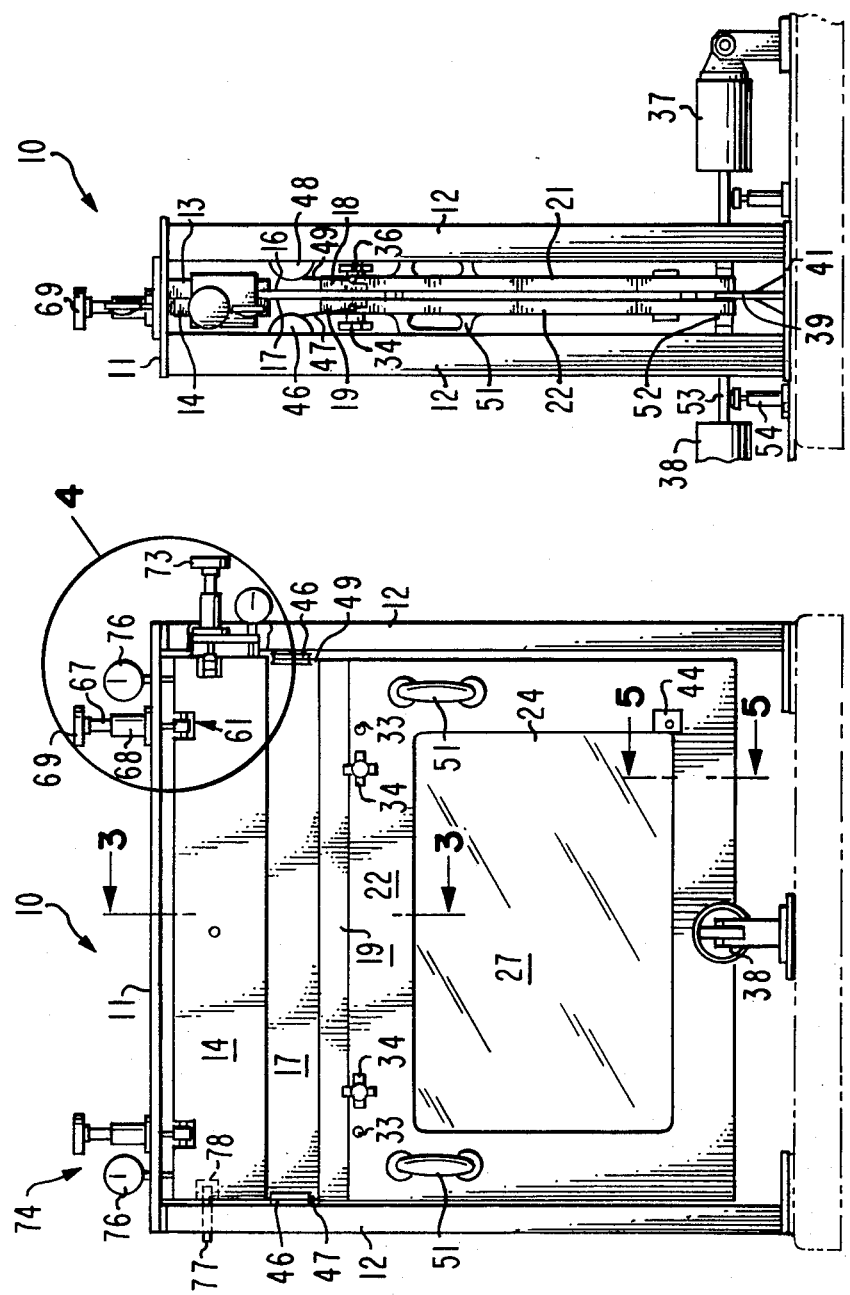
FIG. 1 is a front view of a preferred embodiment.
FIG. 2 is a side view of the preferred embodiment shown in FIG. 1.
Figure 3:
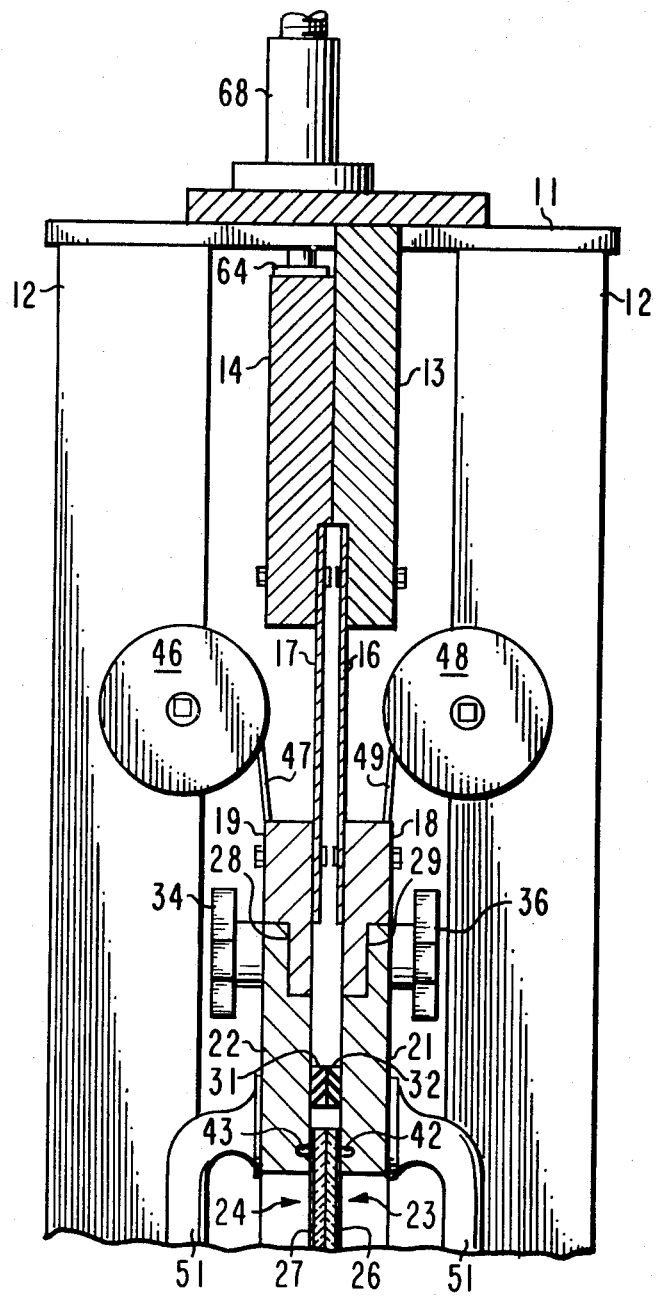
FIG. 3 is a cross-section taken along line 3—3 of FIG. 1.

In FIGS. 1 and 2, a device 10 for holding and aligning pattern bearing photographic plates includes a structure comprised of a horizontal support member 11 and four vertical support members 12. A fixed suspension member 13 is fixed to the horizontal member 11. A moveable suspension member 14 is moveably supported by the horizontal member 11 in a manner fully described hereinafter. The fixed suspension member 13 and the moveable suspension member 14 extend substantially the full width of the device 10 between the vertical support members 12. Additionally, as shown in FIG. 3, the planes of the fixed suspension member 13 and the moveable suspension member 14 are substantially parallel. Accordingly, the moveable suspension member 14 is moveable horizontally and vertically with respect to the plane of the fixed suspension member 13 while maintaining the substantially parallel relationship of the suspension members.

Solid flexible hinges 16 and 17 are affixed to the fixed suspension member 13 and the moveable suspension member 14 respectively. The hinges 16 and 17 preferably are made of flat spring steel and extend substantially the full length of the suspension members 13 and 14. Support members 18 and 19 are suspended from the fixed suspension member 13 and the moveable suspension member 14 by the flexible hinges 16 and 17, respectively. Substantially rectangular frames 21 and 22 are respectively supported by the support members 18 and 19. The frames 21 and 22 include openings 23 and 24, respectively, for receiving photographic plates 26 and 27 which bear the images to be reproduced on a medium between the plates. The support member 19 and the frame 22 are configured to mate along a stepped seam 28 so that the frame 22 is suspended in the plane of the support 19 and the suspension member 14. Similarly, the support 18 and the frame 21 are configured to mate along a stepped seam 29 so that the frame 22 is suspended in the plane of the support 18 and the suspension member 13. Accordingly, when the device 10 is closed, the planes of the frames 21 and 22 are substantially parallel whereby the planes of the photographic plates 26 and 27 also are substantially parallel.

A flexible seal 31 is affixed to the frame 22 and is configured similarly to the opening 24 and extends continuously around the opening. Similarly, a flexible seal 32 is affixed to the frame 21 and continuously extends around the opening 23. The thicknesses of the seals 31 and 32 are selected to maintain the parallel relationship of the frames 21 and 22 and to prevent damage to the photographic plates 26 and 27 when the frames are closed.

As shown in FIG. 1, the frame 22 includes guide holes 33 and the support member 19 includes guide pins (not shown). The guide holes 33 receive the guide pins to accurately locate the frame 22 on the support member 19. After the frame 22 is positioned on the support 19, threaded shankes (not shown) which are fixed to knobs 34 are threaded into threaded holes (not shown) provided in the support 19 to maintain the frame 22 on the support member 19. Additional handles 36 having threaded shanks are utilized to maintain the frame 21 on the support member 18.

As shown in FIG. 2, a pneumatic cylinder 37 is pivotably coupled to the frame 21. Similarly, a pneumatic cylinder 38 is pivotably coupled to the frame 22. A stop 39 extends between the frames 21 and 22 and has a thickness determined by the desired spacing between the internal surfaces of the frames 21 and 22. The stop 39 is affixed to a base 41 and maintains the substantially parallel and vertical relationship of the frames 21 and 22.

Figure 5:
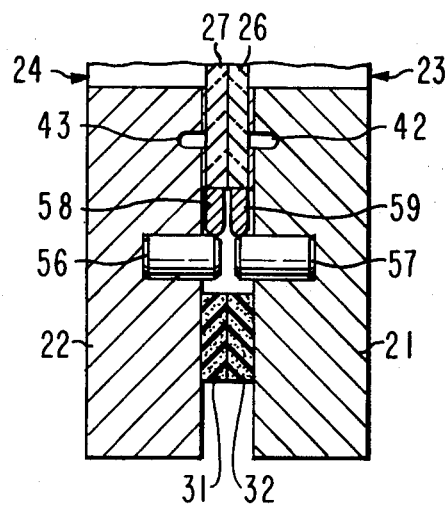
FIG. 5 is a cross-section taken along line 5—5 of FIG. 1.

In FIGS. 3 and 5, the frames 21 and 22 include machined grooves 42 and 43 respectively. The grooves 42 and 43 completely circumvent the openings 23 and 24, respectively. In FIG. 1, the frame 22 supports a pneumatic fitting 44 which communicates with the groove 43. Air is removed from the groove 43 by coupling a pump to the fitting 44 whereby the plate 27 is held in the opening 24 by the vacuum produced by the evacuation of the groove 43. The plate 26 is held in the opening 23 of the frame 21 by the evacuation of the groove 42.

In FIG. 1, reels 46 are rotatably coupled to the vertical support members 12 in the vicinity of both sides of the frame 22. The reels are spring biased and store cables 47 which are coupled to the top of the frame 22. FIGS. 2 and 3 show one of the reels 48 which are coupled by cables 49 to the frame 21.

With the device 10, three motions are available for conveniently performing three functions. The first motion is used to insert the plates 26 and 27 into the openings 23 and 24 of the frames 21 and 22, respectively. The second motion is used to vertically and horizontally move the moveable suspension member 14 with respect to the planes of the fixed suspension member 13 to align the patterns on the photographic plates 26 and 27. The third motion is used to pivot the frames 21 and 22 on the flexible hinges 16 and 17, respectively, to place the medium upon which the photographic exposure is to be made between the plates 26 and 27.

To insert the photographic plate 27 into the opening 24 of the frame 22, the handles 34 are turned to rotate the threaded shanks out of the threaded holes in the support 19. The guide holes 33 are disengaged from the guide pins and with the aid of the handles 51, the frame 22 is pivoted about the pivot point 52 where the frame 22 pivots on the shaft 53 of the pneumatic cylinder 38. A stop 54 is arranged between the base 41 and the shaft 53 to prevent the frame 22 from falling onto the base 41. As the top of the frame 22 is pulled down, the cables 47 unwind from the reels 46. The spring biasing of the reels 46 tends to pull the frame 22 upwardly to the vertical position to assist the operator in reattaching the frame 22 to the suspension member 19.

In FIG. 5, a plurality of locating pins, one of which 56 is shown, is arranged along the bottom and one side of the frame 22. Locating bars, such as the one 58 illustrated, are permanently attached to the plate 27 at positions coincident with the locating pins 56. The operator places the locating bars 58 against the locating pins 56 to accurately locate the photographic plate 27 in the opening 24 of the frame 22. The frame 21 also includes locating pins 57 which engaging locating bars 59 affixed to the photographic plate 26. The photographic plates 26 and 27 are dimensioned to extend beyond the pneumatic grooves 42 and 43 whereby the plates are tightly held in the frames by the vacuum created when the grooves are evacuated.

Figure 4:
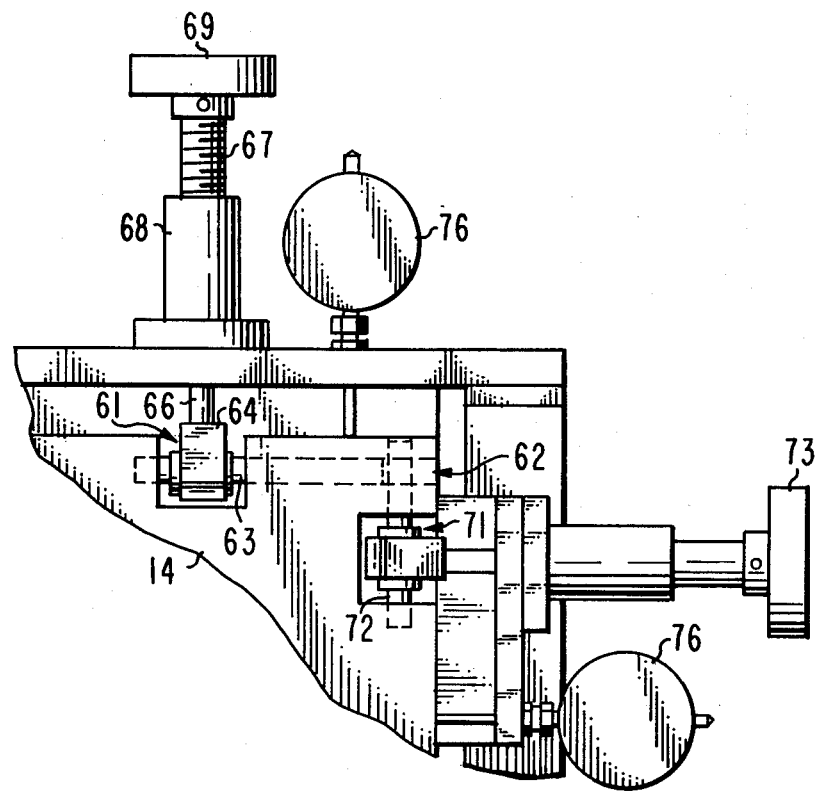
FIG. 4 is an enlarged view of the ballooned portion 4 of FIG. 1.

After the photographic plates 26 and 27 are placed in the frames 21 and 22 the frames are reattached to the suspension members 13 and 14 using the knobs 34 and 36. The moveable suspension member 14 can be vertically and horizontally moved to precisely align the patterns on the plates 26 and 27 in a manner shown in detail in FIG. 4. The moveable suspension member 14 includes a notch 61 which communicates with a bore 62. A pin 63 is inserted into the bore 12 and passes through the notch 61. The pin 63 slidably engages a bushing 64 which is rotatably coupled to a shaft 66. The shaft 66 is affixed to a threaded shaft 67 which is threaded into a threaded sleeve 68. A handle, or gear, 69 is attached to the threaded shaft 67. Rotation of the handle 69 rotates the threaded shaft 67 in the sleeve 68 and the bushing 64 acts against the pin 63 to vertically raise or lower the moveable plate 14. The rotation of the shaft 66 can be effected either manually or automatically with an electric or pneumatic motor. Horizontal motion is effected through a similar arrangement including a notch 71, a pin 72, and a handle 73. The pin 72 passes through the bore 62 and thus inhibits undesirable horizontal movement of the pin 63. A similar arrangement 74 provides vertical adjustment of the other side of the moveable suspension member 14. A pin 77 snugly passes through the vertical support 12 into a vertical slot 78 in suspension member 14. The member 14 slides horizontally on the pin 77 parallel to the axis of the pin and snugly receives the pin to prohibit horizontal motion perpendicular to the plane of the member 14. Dial indicators 76 can be used to indicate the extent of the motion if desired. Both the horizontal and vertical motions occur in the plane of the member 14 and motion perpendicular to such plane is prohibited. Accordingly, the parallel relationship of the suspension members 13 and 14, and thus also of the frames 21 and 22, is maintained as the member 14 is moved.

After the plates 26 and 27 are properly aligned, the device is ready to receive a medium upon which the patterns are to be photographically reproduced. The third motion is effected by actuating the pneumatic cylinders 37 and 38 (FIG. 2) to retract the shafts and separate the bottoms of the frames 21 and 22 by flexing the hinges 16 and 17. The tops of the frames 21 and 22 also separate as the hinges 16 and 17 flex permitting insertion of the medium between the plates 26 and 27. After the medium is between the plates, the shafts of the cylinders 37 and 38 are extended to close the plates tightly against the medium. Light is then passed through the photographic plates to reproduce the pattern on each side of the medium. The shafts of the cylinders 37 and 38 are retracted to separate the frames permitting the removal of the exposed medium and the insertion of an unexposed medium.

What is claimed is:

1. A device for holding and aligning masters used for photographically producing images on both sides of a medium comprising:
   a support structure;
   a fixed suspension member supported by said support structure;
   a moveable suspension member supported by said support structure in the proximity of said fixed suspension member whereby the plane of said fixed suspension member is substantially parallel to the plane of said moveable suspension member;
   means for vertically and horizontally moving said moveable suspension member relative to said fixed suspension member in the plane of said moveable suspension member;
   a first support member suspended from said fixed suspension member through a first flexible hinge;
   a second support member suspended from said moveable suspension member through a second flexible hinge;
   a first frame supported by said first support member, said first frame including an opening for receiving a first photographic plate, and fluid actuated means for holding said plate in said opening;
   a second frame supported by said second support member, said second frame including an opening for receiving a second photographic plate, and fluid actuated means for holding said second plate in said opening; and
   means for pivoting said first and second support members about said first and second hinges whereby said first and second frames are held in a substantially parallel relationship during exposure of said medium, are separable by flexing said hinges during changing of said medium and whereby the images on said plates are alignable by selectively moving said moveable suspension member.

2. The device of claim 1 wherein said fluid actuated means for holding are grooves circumventing said openings, and further including means for evacuating said grooves whereby said plates are vacuum held in said frames.

3. The device of claim 2 wherein said hinges are spring steel.

4. The device of claim 3 wherein said means for pivoting are coupled to a side of said frames opposite said hinges whereby said plates are changeable by rotating said frames about said means for moving.

5. The device of claim 4 wherein said means for pivoting are fluid actuated cylinders.

6. The device of claim 1 wherein said means for vertically and horizontally moving includes separately actuatable vertical and horizontal moving mechanisms.

7. The device of claim 2 wherein said means for vertically and horizontally moving includes separately actuatable vertical and horizontal moving mechanisms.

8. The device of claim 1 wherein said means for moving restrains horizontal movement in a direction perpendicular to the plane of said fixed suspension member.

9. The device of claim 2 wherein said means for moving restrains horizontal movement in a direction perpendicular to the plane of said fixed suspension member.

10. The device of claim 8 wherein said means for vertically and horizontally moving includes separately actuatable vertical and horizontal moving mechanisms.

11. The device of claim 10 wherein said first and second frames include alignment elements for initially aligning said plates in said frames.

12. The device of claim 1 wherein said medium is shadow mask material having photoresistive material on both sides.

13. The device of claim 8 wherein said medium is shadow mask material having photoresistive material on both sides.

* * * * *